United States Patent
Abe et al.

(10) Patent No.: US 8,027,221 B2
(45) Date of Patent: Sep. 27, 2011

(54) MEMORY DEVICE

(75) Inventors: Jin Abe, Kawasaki (JP); Osamu Ishibashi, Kawasaki (JP); Yoshinori Mesaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 185 days.

(21) Appl. No.: 12/560,224

(22) Filed: Sep. 15, 2009

(65) Prior Publication Data

US 2010/0067313 A1   Mar. 18, 2010

(30) Foreign Application Priority Data

Sep. 17, 2008 (JP) ................................. 2008-237836

(51) Int. Cl.
*G11C 8/00* (2006.01)
(52) U.S. Cl. ........... 365/233.1; 365/189.07; 365/189.09; 365/226
(58) Field of Classification Search ............. 365/189.07, 365/189.09, 189.011, 226, 233.1, 233.12, 365/233.13
See application file for complete search history.

(56) References Cited

U.S. PATENT DOCUMENTS

| | | | |
|---|---|---|---|
| 5,804,893 A | 9/1998 | Fujioka | |
| 6,560,158 B2 * | 5/2003 | Choi et al. | 365/226 |
| 7,495,944 B2 * | 2/2009 | Parkinson et al. | 365/148 |
| 7,751,253 B2 * | 7/2010 | Sarin et al. | 365/185.22 |
| 2009/0073795 A1 * | 3/2009 | Pyeon | 365/228 |

FOREIGN PATENT DOCUMENTS

| | | |
|---|---|---|
| JP | 07-130184 A | 5/1995 |
| JP | 09-091969 A | 4/1997 |
| JP | 10-125061 A | 5/1998 |

\* cited by examiner

*Primary Examiner* — Gene N. Auduong
(74) *Attorney, Agent, or Firm* — Westerman, Hattori, Daniels & Adrian, LLP

(57) ABSTRACT

A memory device that can include a power-supply voltage detector that detects power-supply voltage values and that outputs a detection result indicating which power-supply voltage value is detected; a data-rate setter that sets data rates corresponding to the detection result of the power-supply voltage detector, in synchronization with a rising edge or falling edge of a clock signal; and a memory cell array that performs reading/writing at the data rates set by the data-rate setter.

20 Claims, 3 Drawing Sheets

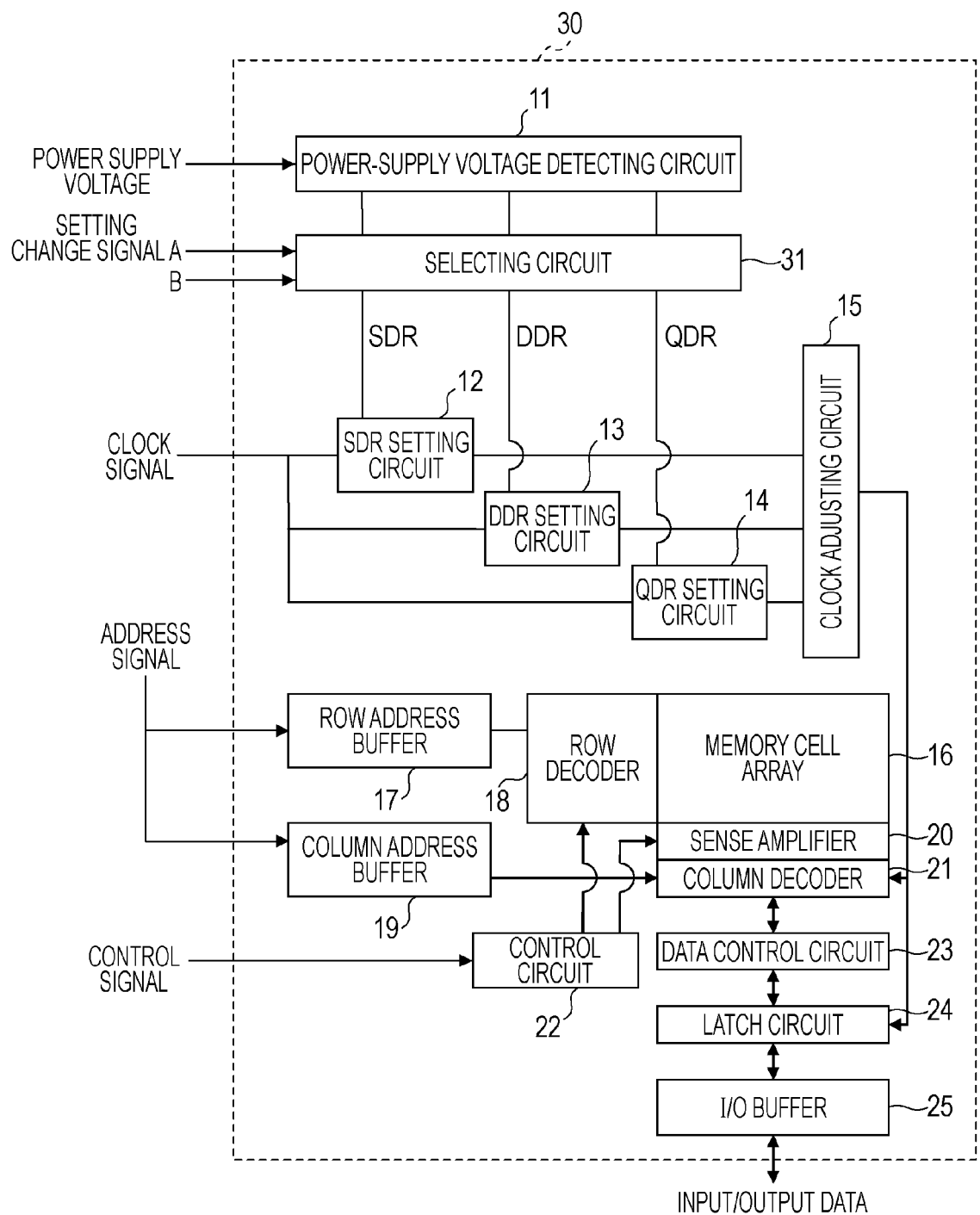

MEMORY DEVICE

CROSS-REFERENCE TO RELATED APPLICATION

This application is based upon and claims the benefit of priority from the prior Japanese Patent Application No. 2008-237836 filed on Sep. 17, 2008, the entire contents of which are incorporated herein by reference.

BACKGROUND

1. Field

The embodiments discussed herein relate to memory devices used for computation processing equipment and information equipment.

2. Description of Related Art

Memories can be broadly divided into RAMs (random access memories) and ROMs (read only memories). The RAMs are volatile memories and the ROMs are nonvolatile memories.

Further, the RAMs are broadly grouped into SRAMs (static RAMs, which do not involve memory retention operation) and DRAMs (dynamic RAMs, which involve memory retention operation, such as refreshing).

The SRAMs feature high-speed read/write access (which is about ten times faster than DRAMs) and the DRAMs feature to have the capability to have increased capacities. Thus, typically, the DRAMs are used as main memories and the SRAMs are used as primary storage memories. With recent improvements in the processing speeds, attempts have been made to reduce the access time of the SRAMs and the DRAMs.

The read/write speeds of the SRAMs and DRAMs are determined by the data rates of interfaces for the memories. Thus, as the data rates, there are an SDR (single data rate) at which a trigger occurs at the rising edge of a clock signal, a DDR (double data rate) at which a trigger occurs at the falling edge of the clock signal in addition to the rising edge of the clock signal, and a QDR (quad data rate) at which a trigger occurs at both the rising edge and the falling edge of the clock signal, with an input port and an output port being separated from each other.

FIG. 1 illustrates the configuration of a known memory device. The known memory device includes an SDR-SDRAM 1, a DDR-SDRAM 2, and a QDR-SRAM 3. The SDR-SDRAM 1, the DDR-SDRAM 2, and the QDR-SRAM 3 include corresponding interfaces 1A to 3A and corresponding memory chips 1B to 3B and are coupled to a CPU (central processing unit) and an input/output device (e.g., a keyboard and a monitor) through a data bus.

Voltages of 1.8 V, 2.5 V, and 5.0 V are supplied from a power source to the interfaces 1A, 2A, and 3A, respectively. A clock signal and an address signal are input to the interfaces 1A to 3A through the data bus, so that input/output (read/write) of data is performed.

The SDR-SDRAM 1 is mainly used as a memory that does not involve high-speed processing, the DDR-SDRAM 2 is mainly used as a main memory having a large capacity, and the QDR-SRAM 3 is mainly used as a primary storage memory that involves high speed processing.

Thus, the known memory device includes memory chips and interfaces for the corresponding data rates. Additionally, voltage values used by the interfaces are different from each other.

The SDR-SDRAM 1, the DDR-SDRAM 2, and the QDR-SRAM 3 are selectively used depending on the application of computation processing equipment or information equipment, its processing capability, or the like, and in some cases, an SDR-SRAM is also used instead of the SDR-SDRAM 1.

SUMMARY

According to an embodiment, a memory device may include: a power-supply voltage detector that detects power-supply voltage values and that outputs a detection result indicating which power-supply voltage value is detected; a data-rate setter that sets data rates corresponding to the detection result of the power-supply voltage detector, in synchronization with a rising edge or falling edge of a clock signal; and a memory cell array that performs reading/writing at the data rates set by the data-rate setter.

It is to be understood that both the foregoing summary description and the following detailed description are explanatory as to some embodiments of the present invention, and not restrictive of the present invention as claimed.

BRIEF DESCRIPTION OF THE DRAWINGS

FIG. 3 illustrates the configuration of a memory device according to a second embodiment.

DETAILED DESCRIPTION OF EMBODIMENTS

Memory devices according to the different embodiments will be described below with reference to the accompanying drawings.

First Embodiment

Figure 2:
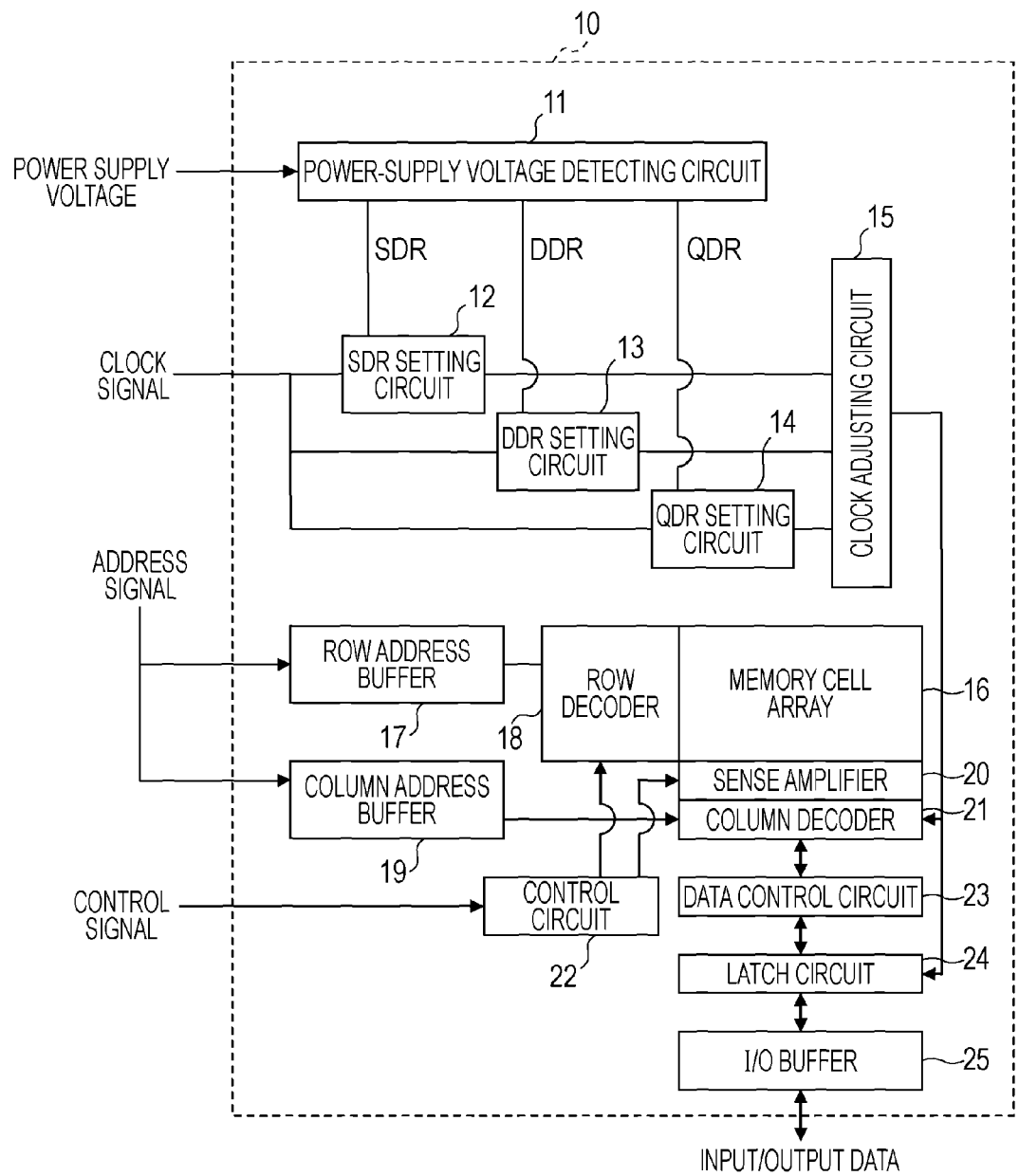
FIG. 2 illustrates the configuration of a memory device according to a first embodiment.

FIG. 2 illustrates the configuration of a memory device according to a first embodiment.

A memory device 10 according to a first embodiment may include a power-supply voltage detecting circuit 11, an SDR (single data rate) setting circuit 12, a DDR (double data rate) setting circuit 13, a QDR (quad data rate) setting circuit 14, a clock adjusting circuit 15, a row address buffer 17, a row decoder 18, a column address buffer 19, a memory cell array 16, a sense amplifier 20, a column decoder 21, a control circuit 22, a data control circuit 23, a latch circuit 24, and an I/O (input/output) buffer 25.

The power-supply voltage detecting circuit 11 is a circuit to which a voltage for performing reading/writing at a corresponding one of SDR, DDR, and QDR is input from a power supply. One of the power supply voltages "0 V", "1.8 V", and "5.0 V", is input into the power-supply voltage detecting circuit 11.

When a voltage of 1.8 V for SDR is input from the power supply, the power-supply voltage detecting circuit 11 outputs a high-level signal to the SDR setting circuit 12, and when a voltage other than a voltage of 1.8 V is input from the power supply, the power-supply voltage detecting circuit 11 outputs a low-level signal to the SDR setting circuit 12. Similarly, when a voltage of 2.5 V for DDR is input from the power supply, the power-supply voltage detecting circuit 11 outputs a high-level signal to the DDR setting circuit 13, and when a voltage other than a voltage of 2.5 V is input from the power supply, the power-supply voltage detecting circuit 11 outputs a low-level signal to the DDR setting circuit 13. Further, when a voltage of 5.0 V for QDR is input from the power supply, the power-supply voltage detecting circuit 11 outputs a high-level signal to the QDR setting circuit 14, and when a voltage other than a voltage of 5.0 V is input from the power supply, the power-supply voltage detecting circuit 11 outputs a low-level signal to the QDR setting circuit 14. Thus, the power-supply voltage detecting circuit 11 serves as a power-supply voltage detector for detecting multiple power-supply voltage values and for outputting a detection result indicating which power-supply voltage value is detected.

In response to the high-level signal from the power-supply voltage detecting circuit 11, the SDR setting circuit 12 sets a trigger for SDR at the rising edge of a clock signal. A signal representing the set SDR trigger is input to the column decoder 21 and the latch circuit 24 via the clock adjusting circuit 15. When the signal input from the power-supply voltage detecting circuit 11 is a low-level signal, the SDR setting circuit 12 does not set the trigger for SDR.

In response to the high-level signal from the power-supply voltage detecting circuit 11, the DDR setting circuit 13 sets a trigger for DDR at the falling edge of the clock signal. A signal representing the set DDR trigger is input to the column decoder 21 and the latch circuit 24 via the clock adjusting circuit 15. When the signal input from the power-supply voltage detecting circuit 11 is a low-level signal, the DDR setting circuit 13 does not set the trigger for DDR.

In response to the high-level signal from the power-supply voltage detecting circuit 11, the QDR setting circuit 14 sets a trigger for QDR at the falling edge of the clock signal. A signal representing the set QDR trigger is input to the column decoder 21 and the latch circuit 24 via the clock adjusting circuit 15. When the signal input from the power-supply voltage detecting circuit 11 is a low-level signal, the QDR setting circuit 14 does not set the trigger for QDR.

As described above, the SDR setting circuit 12, the DDR setting circuit 13, and the QDR setting circuit 14 serve as a data-rate setter for setting multiple data rates corresponding to the detection result of the power-supply voltage detecting circuit 11, in synchronization with the rising edge or falling edge of the clock signal.

The clock adjusting circuit 15 serves as a circuit for achieving synchronization by performing fine adjustment when the SDR trigger signal, the DDR trigger signal, and the QDR trigger signal respectively input from the SDR setting circuit 12, the DDR setting circuit 13, and the QDR setting circuit 14 are out of synchronization.

The power-supply voltage detecting circuit 11, the SDR setting circuit 12, the DDR setting circuit 13, the QDR setting circuit 14, and the clock adjusting circuit 15 can be fabricated as an ASIC (application specific integrated circuit).

Figure 1:
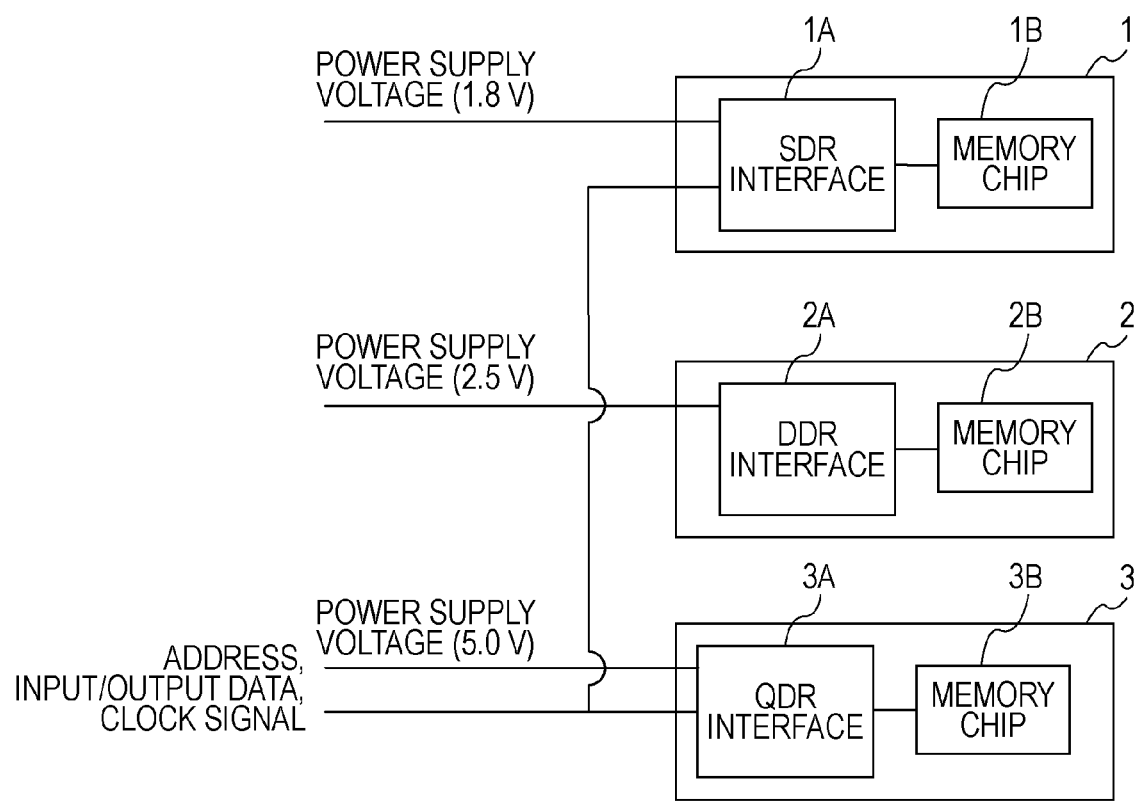
FIG. 1 illustrates the configuration of a known memory device.

The memory cell array 16 has arrayed memory cells in which word lines and bit lines are arranged so as to correspond to rows and columns. The memory cell array 16 is implemented by, for example, a memory cell array that is similar to a memory cell array in a typical dynamic RAM, and may be implemented as a single memory chip into which the SDR-SDRAM 1, the DDR-SDRAM 2, and the QDR-SRAM 3 included in the known memory device illustrated in FIG. 1 are integrated.

The row address buffer 17 temporarily stores a row address of data to be stored in the memory cell array 16 or a row address of data to be read from the memory cell array 16.

The row decoder 18 controls row addresses in the memory cell array 16, and selects a row in the memory cell array 16 on the basis of a row address.

The column address buffer 19 temporarily stores a column address of data to be stored in the memory cell array 16 or a column address of data to be read from the memory cell array 16.

The sense amplifier 20 serves as an amplifier for amplifying data read from the memory cell array 16, data to be written to the memory array cell 16, and data of a column address.

The column decoder 21 controls column addresses in the memory cell array 16, and selects a column in the memory cell array 16 on the basis of a column address.

The control circuit 22 inputs control signals, input through a data bus, to the row decoder 18 and the sense amplifier 20. Examples of the control signals include a CS (chip select) signal, an RAS (row address strobe) signal, a CAS (column address strobe) signal, an OE (output enable) signal, and a WE (write enable) signal.

During data writing, the data control circuit 23 performs control for inputting data, held by the latch circuit 24, to the memory cell array 16. During data reading, the data control circuit 23 performs control for inputting data, output from the memory array cell 16, to the latch circuit 24.

The latch circuit 24 temporarily holds (latches) data input from the I/O buffer 25, before the data is written to the memory cell array 16, or temporarily holds (latches) data read from the memory cell array 16, before the data is output to the data bus.

The I/O buffer 25 serves as a memory area for temporarily storing I/O signals input from or output to the data bus.

The data control circuit 23, the latch circuit 24, and the I/O buffer 25 serve as data input/output circuits.

As described above, according to the memory device 10 of the first embodiment, when a voltage for performing reading/writing at one of the SDR, DDR, and QDR is input, the high-level signal is input from the power-supply voltage detecting circuit 11 to the corresponding one of the SDR setting circuit 12, the DDR setting circuit 13, and the QDR setting circuit 14.

When the high-level signal is input, the SDR setting circuit 12, the DDR setting circuit 13, or the QDR setting circuit 14 sets a trigger signal for the corresponding SDR, DDR, or QDR in response to the rising edge or falling edge of the clock signal.

On the basis of the SDR, DDR, or QDR trigger signal, data is input to or read from the memory cell array 16.

As described above, the memory device according to the first embodiment includes the power-supply voltage detecting circuit 11 for outputting the high-level signal to the SDR setting circuit 12, the DDR setting circuit 13, or the QDR setting circuit 14 in accordance with the input voltage value. Thus, in accordance with the voltage input from the power supply to the power-supply voltage detecting circuit 11, the SDR, DDR, or the QDR trigger signal is set in response to the rising edge or falling edge of the clock signal. Thus, data can be read from or written to the memory cell array 16 at the corresponding SDR, DDR, or QDR.

Thus, in the memory device according to the first embodiment, it is sufficient to use only one memory chip, namely, the memory cell array 16.

As described above, according to the first embodiment, it is possible to provide a memory device having a shared memory chip.

Although a configuration in which the power-supply voltage detecting circuit 11, the SDR setting circuit 12, the DDR setting circuit 13, the QDR setting circuit 14, and the clock adjusting circuit 15 are fabricated as an ASIC has been described above, they may also be implemented as an FPGA (field programmable gate array).

Second Embodiment

FIG. 3 illustrates the configuration of a memory device according to a second embodiment. A memory device 30 according to a second embodiment is different from the above-described memory device according to the first embodiment in that a selecting circuit 31 is disposed between the power-supply voltage detecting circuit 11 and the SDR setting circuit 12, the DDR setting circuit 13, and the QDR setting circuit 14. Since other elements are the same as those in the memory device according to the first embodiment, the same elements are denoted by the same reference numerals and descriptions thereof are not given below.

When a voltage of 1.8 V for SDR, a voltage of 2.5 V for DDR, or a voltage of 5.0 V for QDR is input from the power supply to the power-supply voltage detecting circuit 11 and a corresponding one of a high-level signal for setting SDR, a high-level signal for setting DDR, and a high-level signal for setting QDR is output from the power-supply voltage detecting circuit 11, the selecting circuit 31 serves as a selector that is capable of selecting whether to input (enable inputting of) or not to input (disable inputting of) the high-level signal to the corresponding one of the SDR setting circuit 12, the DDR setting circuit 13, and the QDR setting circuit 14.

The selection of the enabling or disabling is performed based on a setting change signal input from a CPU (central processing unit) through the data bus.

As illustrated in FIG. 3, two types of setting change signal (A and B) are input to the selecting circuit 31 from the CPU through the data bus. In response to the setting change signal (A, B), the selecting circuit 31 selects whether to input (enable inputting of) or not input (disable inputting of) the high-level signal to the SDR setting circuit 12, the DDR setting circuit 13, and the QDR setting circuit 14.

The setting change signal (A, B) has four types: (0, 0), (0, 1), (1, 0), and (1, 1).

The setting change signal (0, 0) is used to change the high-level signals (the high-level signal for setting SDR, the high-level signal for setting DDR, and the high-level signal for setting QDR), input from the power-supply voltage detecting circuit 11, to the low-level signals. That is, when the setting change signal (0, 0) is input to the selecting circuit 31, the inputting of the high-level signals to the SDR setting circuit 12, the DDR setting circuit 13, and the QDR setting circuit 14 is disabled.

The setting change signal (0, 1) is used to directly output the high-level signal for setting SDR, the high-level signal being input from the power-supply voltage detecting circuit 11, to the SDR setting circuit 12. That is, when the setting change signal (0, 1) is input to the selecting circuit 31, the inputting of the high-level signal to the SDR setting circuit 12 is enabled. Thus, when the high-level signal for setting SDR is output from the power-supply voltage detecting circuit 11 and the setting change signal (0, 1) is input to the selecting circuit 31, the SDR setting circuit 12 sets a trigger for SDR at the rising edge of the clock signal.

The setting change signal (1, 0) is used to directly output the high-level signal for setting DDR, the high-level signal being input from the power-supply voltage detecting circuit 11, to the DDR setting circuit 13. That is, when the setting change signal (1, 0) is input to the selecting circuit 31, the inputting of the high-level signal to the DDR setting circuit 13 is enabled. Thus, when the high-level signal for setting DDR is output from the power-supply voltage detecting circuit 11 and the setting change signal (1, 0) is input to the selecting circuit 31, the DDR setting circuit 13 sets a trigger for DDR at the rising edge of the clock signal.

The setting change signal (1, 1) is used to directly output the high-level signal for QDR, the high-level signal being input from the power-supply voltage detecting circuit 11, to the QDR setting circuit 14. That is, when the setting change signal (1, 1) is input to the selecting circuit 31, the inputting of the high-level signal to the QDR setting circuit 14 is enabled. Thus, when the high-level signal for setting QDR is output from the power-supply voltage detecting circuit 11 and the setting change signal (1, 1) is input to the selecting circuit 31, the QDR setting circuit 14 sets a trigger for QDR at the rising edge of the clock signal.

As described above, since the setting change signal (A, B) is input from the CPU to the selecting circuit 31 through the data bus, it is possible to select whether to input or not to input the high-level signal to the SDR setting circuit 12, the DDR setting circuit 13, or the QDR setting circuit 14.

When the high-level signal is input, the SDR setting circuit 12, the DDR setting circuit 13, or the QDR setting circuit 14 sets a corresponding trigger signal for SDR, DDR, or QDR in response to the rising edge of the clock signal.

On the basis of the SDR, DDR, and QDR trigger signals, data is input to or read from the memory cell array 16.

As described above, according to the memory device of the second embodiment, the selecting circuit 31 can select enabling or disabling of inputting data to and reading data from the memory cell array 16. Thus, since the data can be read from and written to the memory cell array 16 at the corresponding SDR, DDR, or QDR, it is sufficient to use only one memory chip, namely, the memory cell array 16.

As described above, according to the second embodiment, it is possible to provide a memory device having a shared memory chip. In addition, even when a voltage of 1.8 V for SDR, a voltage of 2.5 V for DDR, or a voltage of 5.0 V for QDR is input to the power-supply voltage detecting circuit 11, the selecting circuit 31 selects enabling or disabling the SDR setting circuit 12, the DDR setting circuit 13, or the QDR setting circuit 14 to input data to and read data from the memory cell array 16, in accordance with the input voltage.

For example, when the power-supply voltage detecting circuit 11 detects a voltage of 1.8 V, only the SDR setting circuit 12 is enabled to perform data access to the memory cell array 16 and the other DDR setting circuit 13 and QDR setting circuit 14 are disabled to perform data access to the memory cell array 16.

This arrangement allows an appropriate one of the setting circuits to access the memory cell array 16.

Although the memory devices according to the illustrative embodiments of the present invention have been described above, the present invention is not limited to the particularly disclosed embodiments and various changes and modifications can be made thereto without departing from the scope of the claims.

The embodiment described above is a preferred embodiment. The present invention is not limited to this but various modifications can be made without departing from the spirit of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A memory device comprising:
a voltage detector that detects power-supply voltage values and that outputs a detection result indicating which power-supply voltage value is detected;
a data-rate setter that sets data rates corresponding to the detection result of the voltage detector, in synchronization with a rising edge or falling edge of a clock signal; and
a memory cell array that reads/writes at the data rates set by the data-rate setter.

2. The memory device according to claim 1, further comprising:
a selector between the voltage detector and the data-rate setter, to select enabling or disabling of outputting of the detection result of the voltage detector to the data-rate setter.

3. The memory device according to claim 1, wherein the data rates comprise:
a single data rate, a double data rate, and a quad data rate;
the data-rate setter sets the single data rate, the double rate, and the quad data rate in synchronization with the rising edge or falling edge of the clock signal; and
the memory cell array reads/writes at the single data rate, the double data rate, or the quad data rate set by the data-rate setter.

4. The memory device according to claim 1, wherein the voltage detector and the data-rate setter comprise:
an application specific integrated circuit.

5. The memory device according to claim 1, wherein the voltage detector and the data-rate setter comprise:
a field programmable gate array.

6. A memory device comprising:
a voltage detector;
a data rate setter;
a clock adjuster; and
a memory cell array; wherein
the voltage detector is connected to a power supply voltage;
the data rate setter is connected to the voltage detector and the clock adjuster; and
the clock adjuster is connected to the memory cell array.

7. The memory device according to claim 6, wherein the data rate setter is directly connected to the voltage detector;
wherein the data rate setter is directly connected to the clock adjuster;
wherein the clock adjuster is connected to the memory cell array through a latch circuit.

8. The memory device according to claim 6, wherein a selector is connected between the voltage detector and the data rate setter.

9. The memory device according to claim 8, wherein the selector has two control lines.

10. The memory device according to claim 6, wherein the data rate setter comprises:
a single data rate setting circuit;
a double data rate setting circuit; and
a quadruple data rate setting circuit.

11. The memory device according to claim 9, wherein the data rate setter comprises:
a single data rate setting circuit;
a double data rate setting circuit; and
a quadruple data rate setting circuit 12. The memory device according to claim 11 wherein the control lines of the selector are used to determine which data rate setting circuit is selected.

13. The memory device according to claim 10, wherein a clock signal is connected to the single data rate setting circuit, the double data rate setting circuit and the quadruple data rate setting circuit.

14. The memory device according to claim 11, wherein a clock signal is connected to the signal data rate setting circuit, the double data rate setting circuit and the quadruple data rate setting circuit.

15. A memory device comprising:
a voltage detecting circuit;
a data rate setting circuit connected to the voltage detecting circuit, able to set different read/write speeds of a memory cell array; and
a memory cell array connected to the data rate setting circuit.

16. The memory device according to claim 15, wherein the data rate setting circuit comprises:
a single rate setting circuit;
a double data rate setting circuit; and
a quadruple data rate setting circuit.

17. The memory device according to claim 16, wherein the voltage detecting circuit is connected to a power supply voltage; and wherein the voltage detecting circuit selects either the single data rate setting circuit, the double data rate setting circuit or the quadruple data rate setting circuit, depending on the voltage detected from the power supply voltage.

18. The memory device according to claim 17, wherein the single data rate setting circuit, the double data rate setting circuit and the quadruple data rate setting circuit are each connected to a clock adjusting circuit.

19. The memory device according to claim 18, wherein said memory device is an application specific integrated circuit.

20. The memory device according to claim 18, wherein said memory device is a field programmable gate array.

* * * * *